United States Patent [19]
Adelman

[11] Patent Number: 5,837,929
[45] Date of Patent: Nov. 17, 1998

[54] MICROELECTRONIC THERMOELECTRIC DEVICE AND SYSTEMS INCORPORATING SUCH DEVICE

[75] Inventor: Lonnie W. Adelman, San Diego, Calif.

[73] Assignee: Mantron, Inc., San Diego, Calif.

[21] Appl. No.: 627,347

[22] Filed: Apr. 4, 1996

Related U.S. Application Data

[63] Continuation of Ser. No. 270,432, Jul. 5, 1994, abandoned.

[51] Int. Cl.$^6$ .............................. H01L 35/02; H01L 35/34
[52] U.S. Cl. ........................ 136/225; 136/201; 136/203; 204/192.23; 204/192.25; 117/2; 427/526; 427/527; 437/75; 437/141
[58] Field of Search .................................... 136/201, 203, 136/204, 224, 225; 204/192.15, 192.23, 192.25; 427/526, 527; 117/2; 437/75, 141

[56] References Cited

U.S. PATENT DOCUMENTS

| | | | |
|---|---|---|---|
| 2,588,254 | 3/1952 | Lark-Horovitz et al. | 136/89 |
| 3,071,495 | 1/1963 | Hänlein | 117/212 |
| 3,252,013 | 5/1966 | Stanton | 307/132 |
| 3,309,881 | 3/1967 | Beerman | 62/3 |
| 3,436,274 | 4/1969 | Villers | 136/224 |
| 3,437,576 | 4/1969 | Nelson et al. | 204/192 |
| 3,485,680 | 12/1969 | Henderson et al. | 136/208 |
| 3,495,141 | 2/1970 | Dahlberg | 317/235 |
| 3,715,288 | 2/1973 | Risgin | 204/38 A |
| 4,036,665 | 7/1977 | Barr et al. | 136/202 |
| 4,047,436 | 9/1977 | Bernard et al. | 73/362 SC |
| 4,098,617 | 7/1978 | Lidorenko et al. | 148/1.5 |
| 4,211,888 | 7/1980 | Stein et al. | 136/225 |
| 4,571,608 | 2/1986 | Johnson | 357/28 |
| 4,677,416 | 6/1987 | Nishimoto et al. | 338/35 |
| 4,938,244 | 7/1990 | Kumada et al. | 136/212 |
| 4,971,632 | 11/1990 | Rowe | 136/212 |
| 4,983,225 | 1/1991 | Row | 136/201 |
| 5,156,004 | 10/1992 | Wu et al. | 62/3.1 |
| 5,356,485 | 10/1994 | Kreider | 136/225 |
| 5,411,600 | 5/1995 | Rimai et al. | 136/225 |

FOREIGN PATENT DOCUMENTS

| | | | |
|---|---|---|---|
| 58-35991 | 3/1983 | Japan | 136/225 |

OTHER PUBLICATIONS

Augusta, B. A., et al, "Semiconductor Etching Technique", IBM Technical Disclosure Bulletin, vol. 9, No. 6, Nov. 1966, pp. 741–742.

*Primary Examiner*—Kathryn L. Gorgos
*Assistant Examiner*—Chrisman D. Carroll
*Attorney, Agent, or Firm*—McAulay Fisher Nissen Goldberg & Kiel, LLP

[57] ABSTRACT

A method of making a microelectronic thermoelectric device comprises the steps of providing a substrate of a predetermined material, creating thermally isolated, alternating P-type and N-type semiconductor materials on the substrate, electrically connecting the P-type areas to adjacent N-type areas on opposite sides of each P-type area so that each side of a P-type area is connected to an adjacent different N-type area and leaving a free P-type end and a free N-type end, and providing an electrical lead on the free end of the P-type area and an electrical lead on the free end of said N-type area for connection to a source of electrical power. Further, a microelectronic thermoelectric device comprises a plurality of sections of semiconductor material of a first conductivity type and a plurality of sections of second conductivity type opposite to the first type. The sections are arranged to alternate from one type to the other and are thermally isolated from one another. A plurality of metal bridges are provided to interconnect each opposite end of a section to an end of an adjacent different section of opposite conductivity type. Sections of opposite conductivity type at free ends of the arrangement have metal leads attached thereto for the application of electrical energy. The sections have a predetermined height in the range of less than 1 micron to several hundreds of microns. Systems for heating or cooling are described incorporating the microelectronic thermoelectric device.

37 Claims, 7 Drawing Sheets

REPRESENTATIVE 1-COUPLE
THERMOELECTRIC HEAT-PUMP
"C"

STEP 1

POLISH SEMICONDUCTOR WAFER

FIG. 1a

STEP 2

DEPOSIT SPACER MATERIAL ON WAFER

FIG. 1b

STEP 3

GROW EPITAXIAL LAYER OVER SPACER

FIG. 1c

STEP 4

DIFFUSE TO PRODUCE N-TYPE ISLANDS (INCLUDING OXIDE DEPOSITION, MASKING, AND ETCHING STEPS)

FIG. 1d

STEP 5

ETCH TO ISOLATE P-TYPE AND N-TYPE ISLANDS (THERMALLY)

FIG. 1e

STEP 6

FILL VOIDS WITH POLYIMIDE

FIG. 1f

STEP 7

DEPOSIT METAL

FIG. 1g

STEP 8 a. DISSOLVE AWAY WAFER AND REMOVE SPACER MATERIAL
b. DEPOSIT METAL ON REVERSE SIDE AND BOND ON WIRE LEADS

FIG. 1h

STEP 9

ADD GOLD AND CERAMIC PLATES

STEP 1.

SPUTTER METAL
ON SUBSTRATE

F I G. 4a

STEP 2.

SPUTTER N-TYPE
MATERIAL ON

F I G. 4b

STEP 3.

SPUTTER P-TYPE
MATERIAL ON

F I G. 4c

STEP 4.

COAT WITH INSULATION AND LEAVE
OPEN POINTS ON SEMICONDUCTORS
TO BE CONNECTED

F I G. 4d

STEP 5.

SPUTTER METAL
ON INSULATION COATING

MICROELECTRONIC THERMOELECTRIC DEVICE AND SYSTEMS INCORPORATING SUCH DEVICE

This is a continuation of application Ser. No. 08/270,432, filed Jul. 5, 1994, now abandoned.

BACKGROUND OF THE INVENTION a) Field of the Invention

The present invention relates to thermoelectric devices and, more particularly, to microelectronic thermoelectric devices.

b) Description of the Related Art

Thermoelectric devices are known in the art which offer considerable flexibility in cooling and power generation. The physical phenomena for such devices have long been understood. For example, when two wires of dissimilar thermoelectric compositions have their ends joined so as to form a continuous loop, a pair of junctions is established by the respective ends so joined. If the two junctions are at different temperatures, an electromotive force will be set up in the circuit thus formed. This effect is called the thermoelectric or Seebeck effect and the device is called a thermocouple. This effect may be used as a means for making batteries or power generators. Conversely, if the same two dissimilar wires are supplied with power, then the Peltier effect states that heat will be absorbed at one junction and generated at the other junction. The Peltier effect is the basis for thermoelectric cooling.

Active elements of modern thermoelectric devices are made by using various types of materials that exhibit three fundamental characteristics. The first is high electromotive force per degree of temperature difference between the elements of the junctions. This is referred to as the thermoelectric power of the material. The second characteristic is low heat conductivity since it would be difficult to maintain either high or low temperature differentials across a junction if a material conducted heat too readily. The third fundamental characteristic is high electrical conductivity or, conversely, low electrical resistivity. These materials are classified as either N-type or P-type depending upon the direction of current flow across the cold junction formed by the thermoelectric material and another element when operating as a thermoelectric generator according to the Seebeck effect. If the positive current direction at the cold junction is from the cold junction and toward the thermoelectric material, it is termed an N-type thermoelectric material. A pair consisting of P-type material and an N-type material is called a "couple."

Currently, thermoelectric devices are made by hand. First, ingots of P- and N-types of thermoelectric materials are diced into cubes as small as 1 cubic millimeter. Next, the N- and P-type cubes are hand placed using manufacturing jigs between two "pre-soldered" pieces of ceramic. The whole assembly is then heated to bond the cubes to the ceramic. The process requires many intermediate steps by skilled personnel and the resulting thermoelectric devices are crude and relatively expensive.

Recent thermoelectric devices are disclosed in U.S. Pat. Nos. 4,907,060, 4,946,511 and 5,006,178. These and other such devices are generally manufactured as discussed above, i.e., by hand.

OBJECTS AND SUMMARY OF THE PRESENT INVENTION

An object of the present invention is to provide a method for miniaturizing thermoelectric devices. The resultant devices provided by the inventive method will reduce the minimum volume of a half couple from the currently available minimum volume of 1 cubic millimeter to less than 0.01 cubic millimeter (i.e., by more than two orders of magnitude).

Another object of the present invention is to automate the production of thermoelectric devices by building one or more thermoelectric couples on a common substrate material.

A third object of the invention is to produce thermoelectric devices which exhibit much higher temperature uniformity from point-to-point on the device by taking advantage of the fact that all of the couples in the thermoelectric device will be processed from the same physical materials at the same time and under the same conditions. This will also result in higher power generating efficiencies.

A still further object of the present invention is to provide, as a result of the decreased size and increased thermal capacity, an improvement in portable systems where heating and/or cooling is required such as in air conditioners, refrigerators, and the like.

Yet another object of the present invention is to provide thermoelectric devices having substantially higher operational speed than is currently known.

In accordance with the invention, a method of making a microelectronic thermoelectric device comprises the steps of providing a substrate of a predetermined material, creating thermally isolated, alternating P-type and N-type semiconductor materials on the substrate, electrically connecting the P-type areas to adjacent N-type areas on opposite sides of each P-type area so that each side of a P-type area is connected to an adjacent different N-type area and leaving a free P-type end and a free N-type end and providing an electrical lead on the free end of the P-type area and an electrical lead on the free end of the N-type area for connection to a source of electrical power.

Also in accordance with the invention, a microelectronic thermoelectric device comprises a plurality of sections of semiconductor material of a first conductivity type and a plurality of sections of second conductivity type opposite to said first type. The sections are arranged to alternate from one type to the other and are thermally isolated from one another. A plurality of metal bridges are provided to interconnect each opposite end of a section to an end of an adjacent different section of opposite conductivity type. Sections of opposite conductivity type at free ends of the arrangement have metal leads attached thereto for the application of electrical energy. The sections have a predetermined height in the range of less than 1 micron to several hundreds of microns.

For a better understanding of the present invention, reference is made to the following description and accompanying drawings while the scope of the invention will be pointed out in the appended claims.

DESCRIPTION OF THE PREFERRED EMBODIMENTS

Figure 1A:
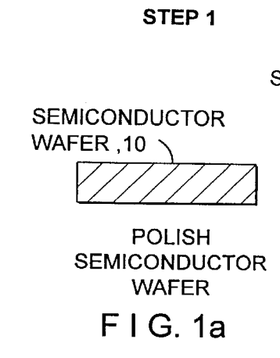
FIGS. 1(a)–(i) illustrate diagrammatically in cross-section the various steps in manufacturing a microelectronic thermoelectric device using thin film techniques starting with a P-type substrate.
Figure 1B:
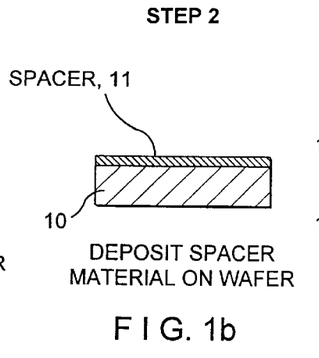
Figure 1C:
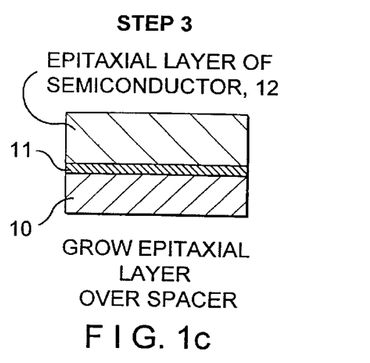

Referring now to FIGS. 1(a) through 1(i), reference is made to FIG. 1(a) (step 1). In that figure, a semiconductor wafer of the P-type is the starting point and in the first step the wafer is polished by known techniques. In step 2 (FIG. 1(b)), a spacer material is deposited on the wafer by known techniques. The spacer functions to protect the device being fabricated from being ruined by etchants used to remove the wafer. The spacer material to be used is dependent upon the epitaxial material composition. In one particular application, indium phosphide was utilized. In step 3 (FIG. 1(c)), an epitaxial semiconductor layer 12 is grown over the spacer 11.

Figure 1D:
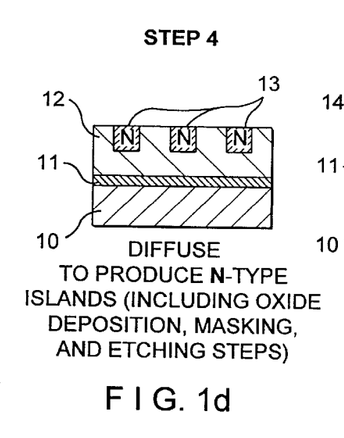
Figures 1E, 1F:
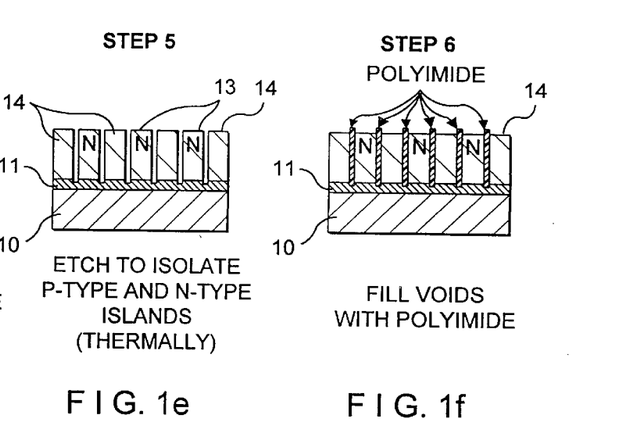

The next step, shown in FIG. 1(d), is step 4. In the epitaxial layer, N-type islands are diffused. This is done again by known techniques which include oxide deposition, masking and etching steps. Step 5, shown in FIG. 1(e), illustrates that the diffused N-type island is then etched to isolate P-type and N-type islands in a thermal sense. FIG. 1(f) illustrates step 6 in which the voids between the islands are filled with a thermal and electrical insulator 15, such as polyamide or the like. Alternatively, the P-type and N-type islands may be directly created by ion deposition.

Figures 1G, 1H, 1I:
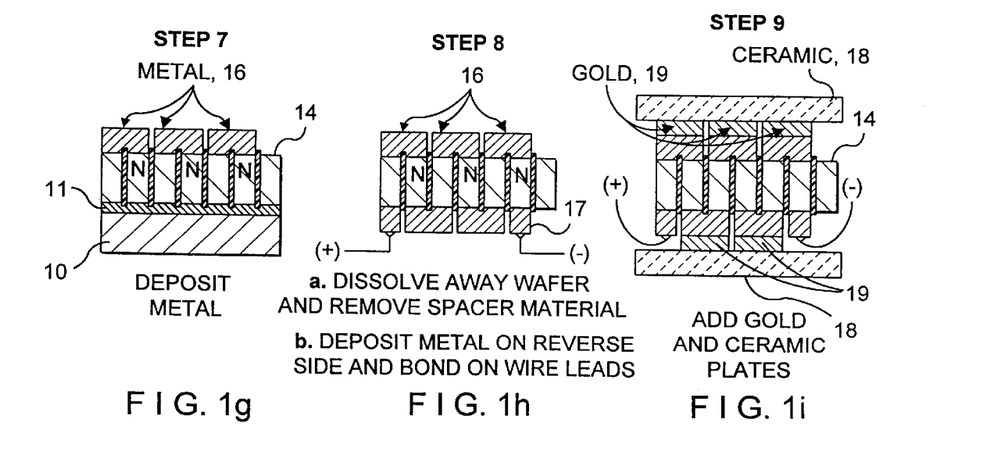

Referring now to step 7 in FIG. 1(g), metal ends 16 are deposited to bridge N- and P-type sections. The following step, step 8 in FIG. 1(h), illustrates how the reverse side is processed. In this step both the wafer and spacer material are sequentially removed and metal is deposited to interconnect the N- and P-type sections, however, this is done so that the metal connections on either side between P- and N-type sections alternate. For use as such metal, a metal of very low resistivity is required. It may also be desirable to avoid negative metallurgical interaction at the junction of the semiconductor and the metallization. Finally, in FIG. 1(i), step 9 is shown wherein gold and ceramic plates 19 and 18 are added to both sides of the device.

Figure 2:
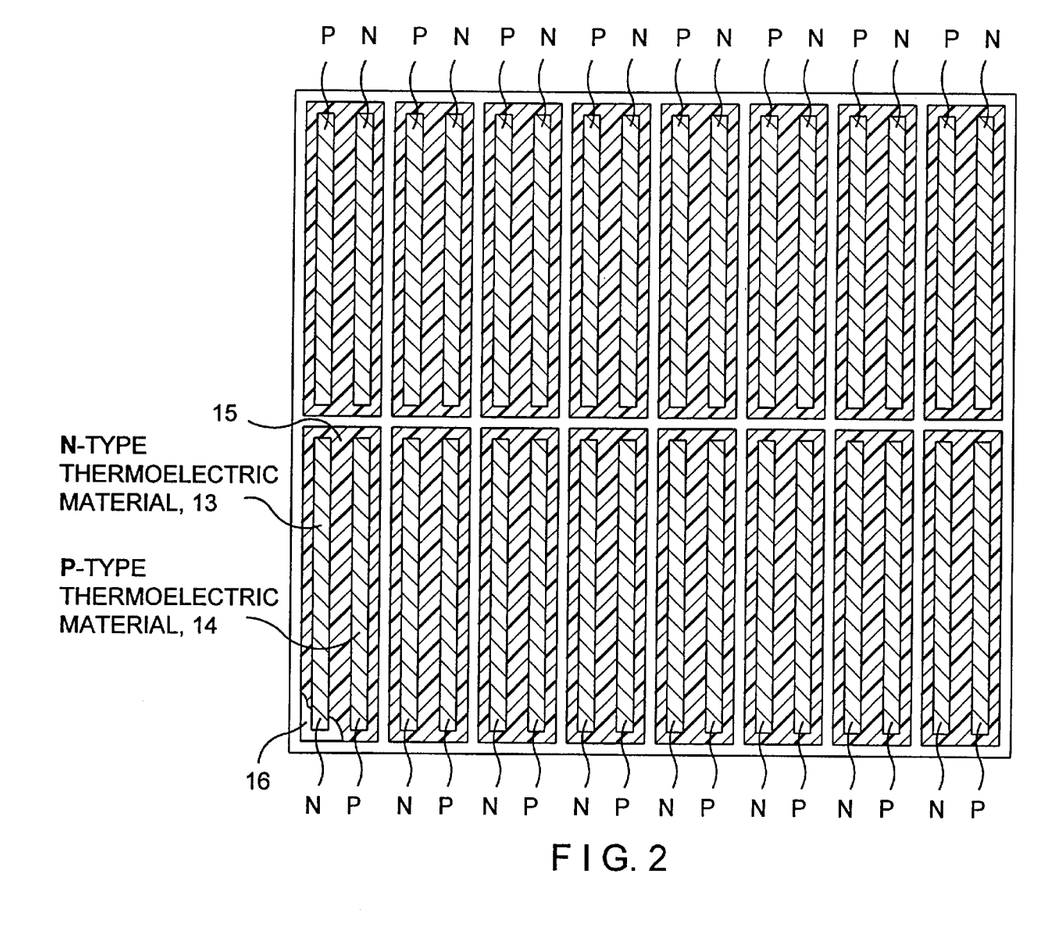
FIG. 2 illustrates a top view of a 16 couple microelectronic thermoelectric device of the type shown in FIGS. 1(a)–(i)(with top ceramic plate and top metallization not shown)

Referring now to FIG. 2, a 16 couple microelectronic thermoelectric device is shown from a top view. Note that the top ceramic plate and metallization are not shown so that the semiconductor material can be observed. In this representation, the same element numbers are used as in FIGS. 1(a)–(i). The adjacent N-type and P-type thermoelectric material sections 13 and 14 are illustrated with insulation 15 therebetween. These sections are interconnected at the bottom by metal 16.

Figure 3:
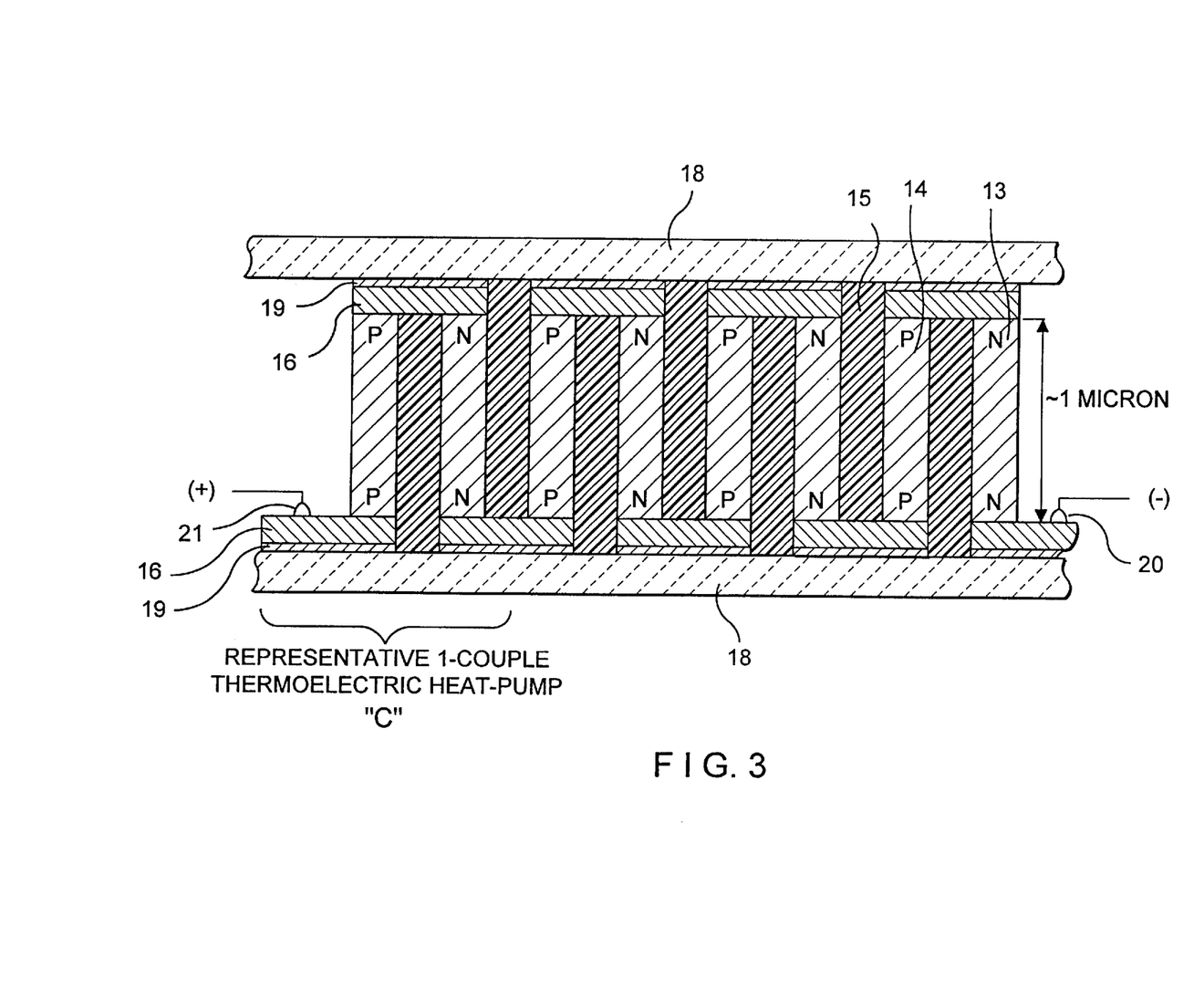
FIG. 3 illustrates a more detailed cross-section of the microelectronic thermoelectric device of the type of FIGS. 1(a)–(i)

Referring now to FIG. 3, a more detailed illustration of the cross-section of a completed microelectronic thermoelectric device is shown. Once again, the same element numbers are used as in the prior figures. At the top and bottom of the device, ceramic plates are present. Ceramics for such plates may typically be aluminum oxide. The ceramic plates sandwich a gold layer and metal layer at either end of the P- and N-type sections. Between the P- and N-type sections are sections of insulating material 15. At appropriate portions of the metal 16, contacts for electrical leads 20 and 21 are applied. The approximate dimension from top to bottom of a P- or N-type section is 1 micron although this dimension may, under certain circumstances, be less than 1 micron to several hundreds of microns. Also shown in FIG. 3, a representative 1 couple thermoelectric heat pump is designated as C. For use as the starting P-type material in this construction, known semiconductors such as InP and InGaAs may be used. BiTe would be a particularly suitable semiconductor material for room temperature applications.

For the production of an optimal integrated circuit thermoelectric device, it is preferred that a very low resistance (ideally a sub-10 ohm resistance) exist between the metallization layer and the doped semiconductor. In this regard, silicon or a Ge-Si alloy may be preferred as the semiconductor material because of low junction resistance.

Utilizing the construction method of the present invention, it is believed that the cost of microelectronic thermoelectric devices can be reduced by at least two orders of magnitude in comparison with prior techniques. Similarly, the speed with which such units can be manufactured can also be reduced by several orders of magnitude in comparison with the prior hand production techniques.

While the above method has been described starting from a P-type semiconductor, no substantial difference exists in the inventive method in using an N-type substrate as a starting element.

Figure 4A:
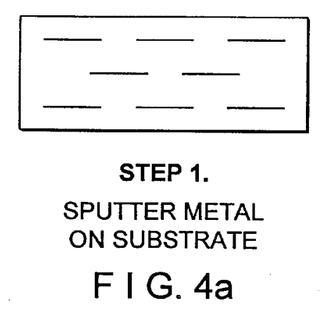
FIGS. 4(a)–(e) illustrate the steps of manufacturing a microelectronic thermoelectric device using thick film techniques.
Figure 4B:
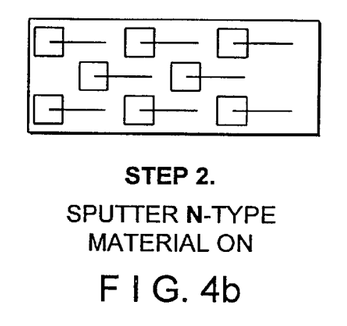
Figure 4C:
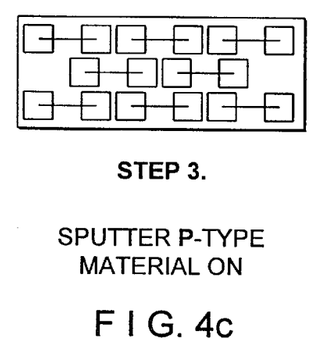

Referring to FIGS. 4(a)–(e), a method for making a microelectronic thermoelectric device using thick film techniques (e.g., sputtering) is shown. Starting with a substrate material such as glass, FIG. 4(a) illustrates that metal is applied in step 1 to the substrate in predetermined bands to function later as metal bridges between semiconductor sections. Step 2, shown in FIG. 4(b), illustrates that semiconductor material of a first conductivity type (e.g., N-type) is applied by sputtering to one end of each metal bridge. FIG. 4(c) illustrates the application of the semiconductor material of second conductivity type opposite to the first type (e.g., P-type) applied to second ends of the metal bridges. Note that the P- and N-type sections are thermally isolated so as to form islands with respect to one another.

Figure 4D:
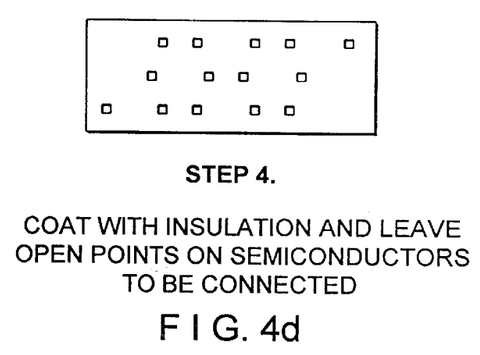
Figure 4E:
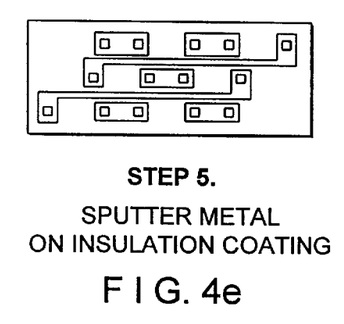

Step 4, shown in FIG. 4(d), applies a coating of insulation, leaving open points of the semiconductor sections for interconnections by metal bridges on the opposite sides of the sections. Step 5, shown in FIG. 4(e), illustrates the application of the metal bridges, e.g., by sputtering of metal. Not shown is the final step of applying metal leads to free end sections as has been previously discussed. Note that in step 1, the metal may instead be applied as a thin film on the substrate without affecting the overall method.

Many advantages clearly result from a microelectronic thermoelectric device in accordance with the invention. For example, since a 40,000 couple device would probably occupy an area of 0.3 square centimeters in accordance with the invention, the temperature uniformity of each device of each device would be unparalleled because, first, there would probably be about only 1 micron between couples in comparison with several millimeters with respect to conventional devices; and, second, since all couples on a wafer are processed under the same conditions using the same material, their individual response to current would be almost identical in comparison with conventional devices. Further, individual couples or groups of couples can be controlled simultaneously and independently using devices in accordance with the invention to yield very tight temperature control for as small as a 10 square micron area. Finally, the small size of the microelectronic devices allows for higher operational speed than has been previously known.

Based on the microelectronic thermoelectric device of the present invention, systems in a variety of applications can readily be improved. These include, among others, portable air conditioners, environmental control systems, automotive air conditioning, leisure equipment (portable refrigerators for camping, boating, etc.), electronic equipment cooling, refrigerators for consumer and industrial industries (to replace compressor and freon), biotechnology industry systems (temperature cyclers), insulated containers, surgical equipment (fluid temperature controls), vending machines (to replace compressor and freon), dehumidifiers for cabinets or closets, military applications (e.g., guidance and control, air conditioning for submarines and tanks, airconditioning suits, blood keepers (for transporting blood and plasma), trucking industry (smaller refrigerator trucks), printing industry (maintenance of ink viscosity), photography applications (e.g., maintenance of unprocessed film temperature and temperature control of printing and developing baths), fluid control in pipes by selective freezing of fluid in specific capillaries, medical applications (e.g., microtome sample coolers, hot-cold microscope stage, dew point meters, gas chromatography, oxygen tent cooler), distillation units and miniature power generators.

Because of the advantages of the microelectronic thermoelectric device of the present invention, new systems applications are conceivable which could not have been remotely possible before. Such systems include the environmental control of buildings by bonding thermoelectric devices in accordance with the invention onto glass, environmentally controlled work suits for industrial application, temperature cycling in a tube, and a coaster for a hot or cold beverage that maintains the beverage's initial temperature for long periods of time without batteries or any other power source. Of course, the above list of applications does not foreclose use of the inventive device in a variety of other applications.

Figure 5:
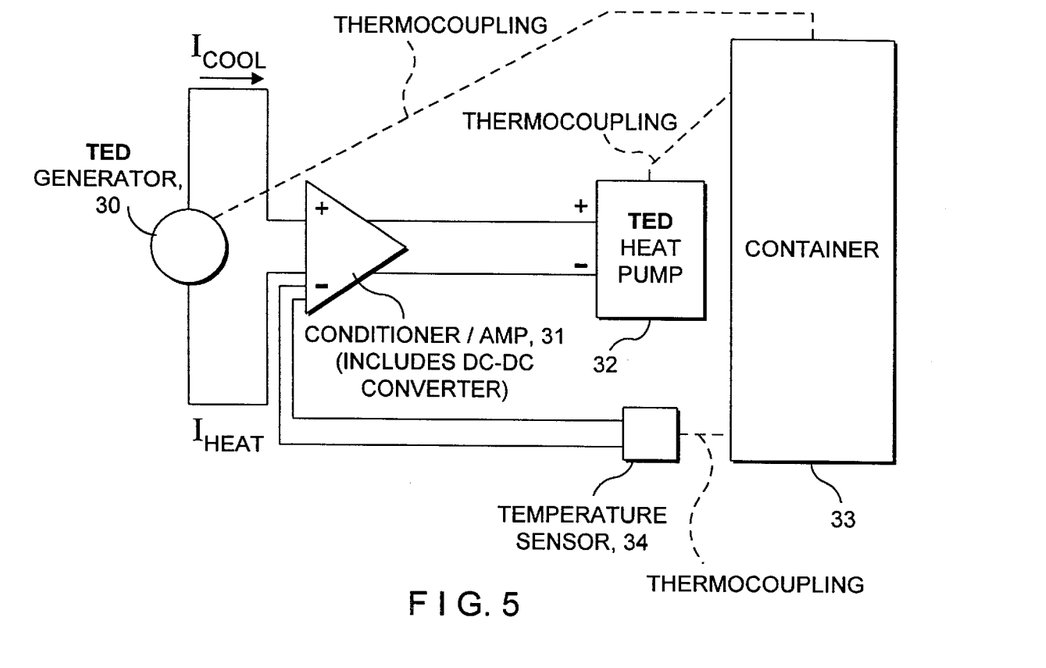
FIG. 5 illustrates a pseudo-insulator system using the microelectronic thermoelectric device of the present invention.

Examples of particular systems using the microelectronic thermoelectric device of the present invention will now be described. FIG. 5 illustrates a pseudo-insulator system for a container and its contents. The system requires a generator 30 for providing a source of electrical energy which is applied through a conditioner/amplifier (including a dc-dc converter) 31 to a heat pump 32. The generator 30 is itself a thermoelectric device in the power generation mode. A thermocouple device 34 senses the temperature of the container 33 and feeds back a signal to the conditioner/amplifier 31. It would also be possible to integrate several separate thermoelectric couples onto a common substrate with the thermoelectric generator for the purposes of temperature sensing. The heat pump 32 and generator 30 utilizing the microelectronic thermoelectric device of the present invention are thermally coupled to the container. Depending on conditions, the generator 30 and heat pump 32 will either cool or heat the container (i.e., source or sink current depending on the temperature of the container being temperature controlled). The system thus attempts to maintain the temperature of the container to whatever temperature it was before applying the pseudo-insulator system. The degree of temperature maintenance will be a function of system efficiencies and the initial temperature of the container. Such system, because of small size and high efficiency, would be applicable, for example, to maintaining the temperature of a coffee decanter, a cocktail coaster or blue ice. Because of the size and cost of prior microelectronic systems, such constructions would have been completely impractical.

Figures 6A, 6B:
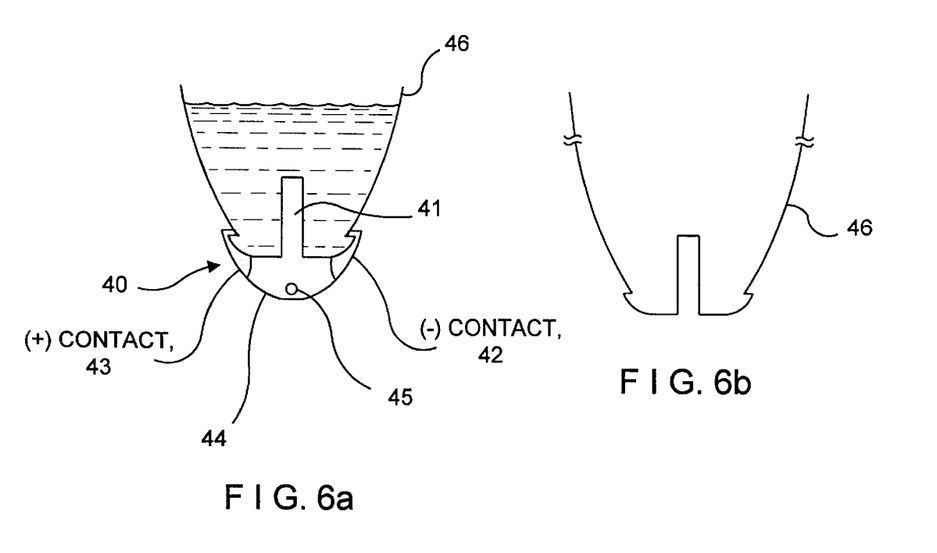
FIG. 6(a) is a cross-section of an integrated microelectronic thermoelectric device/plastic tube system.
FIG. 6(b) is a cross-section of the plastic tube for use in the system of FIG. 6(a)

Another system example of the present invention will now be described. Shown in FIGS. 6(a), 6(b), 7(a)–(c), 8(a)–(d), 9 and 10 are various aspects of a system for maintaining the temperature of a liquid disposed in a plastic tube. The tube shown as 46 in FIG. 6(a) has, in use, a microelectronic thermoelectric system 40 disposed at its tip. Alternatively, the members of the couples can be disposed to run the length of the shaft of the device. The system 40 includes a heat sink portion 44, contact portions 43 and 42 for application of electrical energy and a microelectronic thermoelectric device portion 41 in accordance with the invention. Preferably, a position key 45 is provided. The shape of the plastic tube 46 is shown in FIG. 6(b). The system 40 is removable from the tube to allow the tube to be autoclaved and/or to allow the system to be reusable.

Figure 7A:
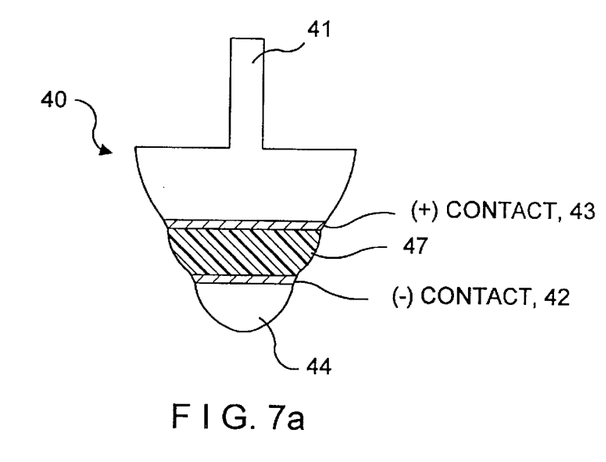
FIG. 7(a) is a cross-section of a variation of the microelectronic thermoelectric device shown in FIG. 6(a)
Figure 7B:
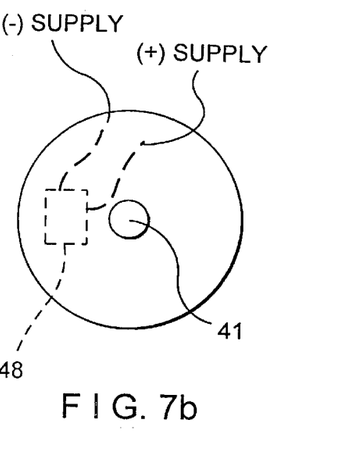
FIG. 7(b) is a top schematic view of the device of FIG. 7(a)

FIGS. 7(a) and (b) illustrate another arrangement for the microelectronic thermoelectric system. There, the electrical contacts are arranged one over the other with insulation 47 therebetween. The device 41, as in the earlier FIGS. 6(a) and (b), is still centrally located and functions mostly as a heat pump but is configured as a generator for temperature feedback. FIG. 7(b) illustrates the location of a microprocessor 48. FIGS. 7(a) and 7(b) are arranged for application of an external controller.

Figure 8A:
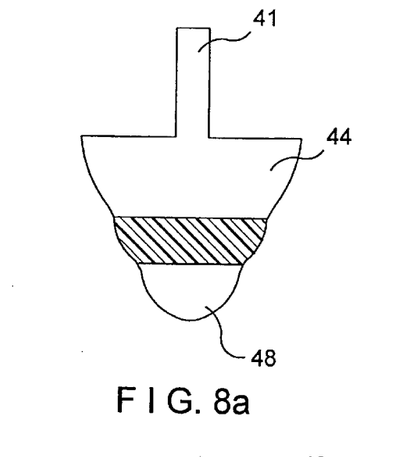
FIG. 8(a) is a cross-section of another variation of the device shown in FIG. 7(a)
Figure 8B:
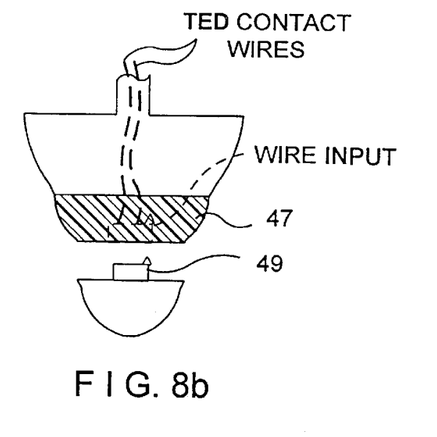
FIG. 8(b) is a further cross-sectional view of the device of FIG. 8(a)
Figure 8C:
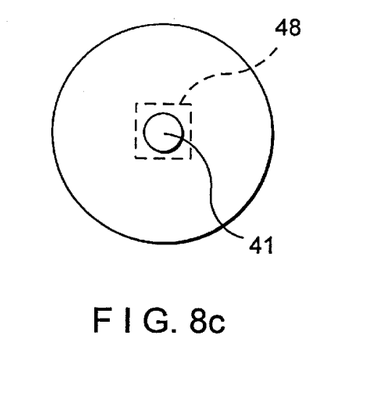
FIG. 8(c) is a top schematic view of FIG. 8(a)
Figure 8D:
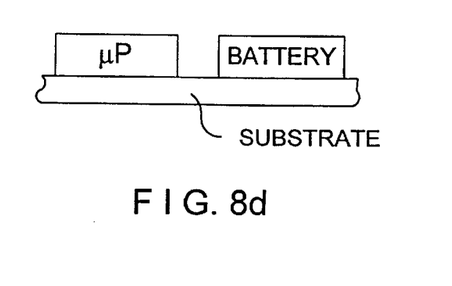
FIG. 8(d) is a schematic side view of the construction of the microprocessor/drive transistor and battery shown in FIG. 8(c)

FIGS. 8(a)–(d) illustrate a further embodiment with heat sink at the top and microprocessor 48/drive transistor/battery at the bottom. In FIG. 8(b), the inclusion of a start switch is shown.

Figure 9:
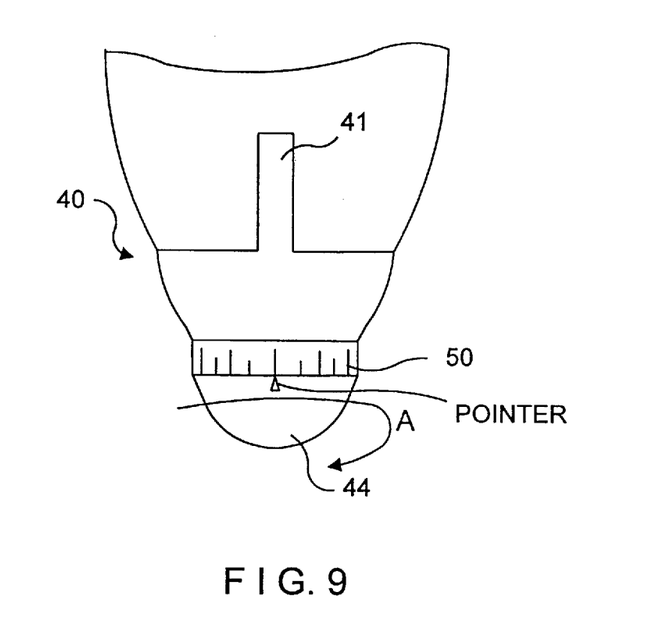
FIG. 9 is still another variation shown in cross-section of the devices shown in FIGS. 7(a) and 8(a)
Figure 10:
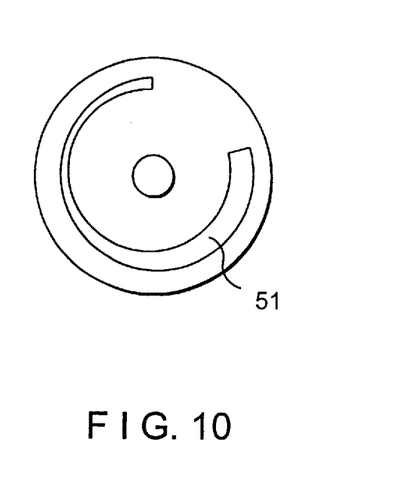
FIG. 10 illustrates a top view of the location of the resistor in FIG. 9.

FIGS. 9 and 10 illustrate another variation of the device shown in FIGS. 6(a)–8(d). There, the device is shown to include a thick film variable resistor 51 to allow an adjustment of the desired temperature. The bottom portion of the device is rotatable in the direction A in FIG. 9. A temperature scale 50 may also be provided.

While the foregoing description and drawings represent the preferred embodiments of the present invention, it will be obvious to those skilled in the art that various changes and modifications may be made therein without departing from the true spirit and scope of the present invention.

What is claimed is:

1. A method of making a microelectronic thermoelectric device comprising the steps of:

providing a substrate of a material;

creating thermally isolated, alternating P-type and N-type semiconductor materials on said substrate so that said combined substrate and semiconductor materials have an overall height of approximately 1 micron or less;

electrically connecting the P-type areas to adjacent N-type areas on opposite sides of each P-type area so that each side of a P-type area is connected to an adjacent different N-type area and leaving a free P-type end and a free N-type end;

providing an electrical lead on said free end of said P-type area and an electrical lead on said free end of said N-type area for connection to a source of electrical power.

2. The method of claim 1, wherein said P-type and N-type semiconductor materials are created by ion deposition.

3. The method of claim 1, wherein said P-type and N-type semiconductor materials are created by thin film techniques.

4. The method of claim 3, wherein said substrate is a semiconductor wafer wherein said P-type and N-type materials are created by providing said semiconductor wafer with a polished surface and wherein the method includes the steps of providing a spacer on said surface, forming an epitaxial layer of first semiconductor material on the spacer and diffusing a semiconductor of second conductivity type in said epitaxial layer.

5. The method of claim 1, wherein said P-type and N-type semiconductor materials are created by thick film techniques.

6. The method of claim 5, wherein said substrate is glass and said semiconductor materials are applied by sputtering.

7. A microelectronic thermoelectric device made by the method of claim 1.

8. A method of making a microelectronic thermoelectric device comprising the steps of:

providing a semiconductor material substrate, said substrate having a first substrate surface and a second substrate surface;

forming areas of a first conductivity type in said material;

forming a semiconductor of second type conductivity material opposite to said first type to produce islands of first and second types;

isolating the islands of first type material from the islands of second type material by creating voids therebetween so that each island has a first end surface on said first substrate surface and a second end surface on said second substrate surface;

forming metal bridges between adjacent islands of opposite type on said first end surfaces of said islands and attaching metal to one end island, forming metal bridges between adjacent islands of opposite type on said second end surfaces thereof and attaching metal at another end island so that the metal bridges connecting said second ends are not in parallel with the metal bridges connecting said first ends; and attaching metal leads to respective metal portions on said end islands.

9. The method of claim 8, wherein the first conductivity type material is P-type and the second semiconductor type material is N-type.

10. The method of claim 9, wherein the P-type material is selected from the group consisting of InP, InGaAs, BiTe, Si and an alloy of Ge-Si.

11. The method of claim 8, wherein the first conductivity type material is N-type and the second conductivity type material is P-type.

12. The method of claim 8, wherein said isolating step involves etching the semiconductor material.

13. The method of claim 8, wherein the metal bridges are formed by depositing the metal.

14. The method of claim 8, wherein said semiconductor materials of first and second conductivity are formed by ion implantation.

15. The method of claim 14, wherein the forming of said semiconductor of second conductivity type is performed by diffusing.

16. The method of claim 15, wherein the diffusing step further includes oxide deposition, masking and etching steps.

17. The method of claim 8, including the steps of providing a semiconductor wafer having a polished surface, forming a spacer material on said polished surface, forming an epitaxial layer of first conductivity type on the spacer material and forming a semiconductor of second type conductivity in said epitaxial layer.

18. The method of claim 17, including the step of removing the semiconductor wafer and spacer material to expose said second ends of said islands.

19. The method of claim 18, including the step of forming a layer of gold on said metal bridges on said first and second ends.

20. The method of claim 19, including the step of affixing a ceramic plate to each gold layer.

21. The method of claim 17, wherein the epitaxial semiconductor layer is grown on said spacer material.

22. The method of claim 8, including the step of filling the voids with an insulating material.

23. The method of claim 22, wherein the voids between the semiconductor materials of opposite conductivity type are filled with thermal and electrical insulating material.

24. The method of claim 23, wherein said thermal and electrical insulating material is polyamide.

25. The method of claim 8 wherein each of said metal bridges is formed over substantially all of an end surface of an island of first type material and substantially all of an end surface of an island of second type material.

26. A method of malting a microelectronic thermoelectric device comprising the steps of:

providing a substrate of a non-metallic material;

applying metal bridges to said substrate;

applying a first electrical interface coating onto the metal bridges;

applying a semiconductor material of a first semiconductivity type on alternate ones of said coated metal bridges so that the height of said material of first conductivity type is approximately 1 micron;

applying a semiconductor material of a second conductivity type following application of said semiconductor material of first conductivity type on the remaining coated metal bridges so that the height of said material of second conductivity type is approximately 1 micron;

applying a second electrical interface on all of the applied semiconductor areas of first and second conductivity types;

applying metal bridges to said second interface coating, said applied metal bridges allowing a free end of a semiconductor area of first conductivity type and a free end of a semiconductor area of second conductivity type; and applying an electrical lead on said free end of semiconductor area of first conductivity type and an electrical lead on said free end of semiconductor area of second conductivity type.

27. The method of claim 26, wherein said semiconductor material of first conductivity type is P-type and said semiconductor material of second conductivity type is N-type.

28. The method of claim 26, wherein said semiconductor material of first conductivity type is N-type and said semiconductor material of second conductivity type is P-type.

29. The method of claim 26, wherein said semiconductor materials are applied using thick film techniques.

30. The method of claim 29, wherein said semiconductor materials are applied by sputtering.

31. The material of claim 26, wherein said metal bridges are applied by sputtering.

32. The method of claim 26, wherein said substrate is glass.

33. The method of claim 26, wherein said semiconductor material of said first and second conductivity type is selected from the group consisting of InP, InGaAs, BiTe, Si and Ge-Si.

34. A microelectronic thermoelectric device made largely by the method of claim 26.

35. A method of making a microelectronic thermoelectric device comprising the steps of:

providing a semiconductor material substrate, said substrate having a first surface and a second surface;

forming alternating islands of first and second type conductivity material in said semiconductor substrate;

isolating the islands of first type material from the islands of second type material by creating voids therebetween so that each island has a first end on said first surface and a second end on said second surface;

forming metal bridges between adjacent islands of opposite type on said first ends of said islands; and forming metal bridges between adjacent islands of opposite type on said second ends thereof so that the metal bridges connecting said second ends are not in parallel with the metal bridges connecting said first ends.

36. A microelectronic thermoelectric device comprising:

a plurality of sections of semiconductor material of a first conductivity type and a plurality of second conductivity type, said sections being arranged so as to alternate from one another;

said sections having cavities therebetween which are filled with an insulating material;

a plurality of metal bridges interconnecting each opposite end of a section to an end of an adjacent different section of opposite conductivity type;

sections of opposite conductivity type at free ends of said arrangement having metal leads attached thereto for the application of electrical energy; and wherein said sections have a height in the range approximately 1 micron.

37. The microelectronic thermoelectric device of claim 36, wherein said alternating sections of semiconductor material are arranged in a plurality of rows.

* * * * *